United States Patent [19]

Johnson

[11] Patent Number: 4,693,119
[45] Date of Patent: Sep. 15, 1987

[54] LITHIUM BATTERY ENERGY MONITOR

[75] Inventor: Leopold J. Johnson, Valley Center, Calif.

[73] Assignee: The United States of America as represented by the Secretary of the Navy, Washington, D.C.

[21] Appl. No.: 819,947

[22] Filed: Jan. 17, 1986

[51] Int. Cl.[4] ............................................. G01N 29/00
[52] U.S. Cl. ...................................... 73/579; 340/636; 324/436
[58] Field of Search ........................ 73/579; 340/636; 324/436; 368/114

[56] References Cited

U.S. PATENT DOCUMENTS

| | | | |
|---|---|---|---|
| 3,029,384 | 4/1962 | Hart | 368/114 |
| 3,359,494 | 12/1967 | Anderson et al. | 324/436 |
| 3,555,308 | 1/1971 | Peterson | 368/114 |
| 3,665,308 | 5/1972 | Beusman | 368/114 |
| 3,753,110 | 8/1973 | Ikeda et al. | 368/114 |
| 4,100,490 | 7/1978 | Peck et al. | 368/114 |
| 4,264,861 | 4/1981 | Radu et al. | 324/428 |

Primary Examiner—Anthony V. Ciarlante
Attorney, Agent, or Firm—Robert F. Beers; Ervin F. Johnston; Thomas Glenn Keough

[57] ABSTRACT

A lithium battery is provided with an energy monitor that continuously indicates the energy remaining in the battery. An electrolytic coulometer is connected in series with the battery and has a cantilevered cathode which increases its mass in proportion to the total amount of current that flows from the battery. Since the mass of the cathode and hence its resonant frequency changes in proportion to the total current, a mechanical transducer in contact with the electrolytic coulometer causes the cantilevered cathode to resonate at different frequencies which is monitored to provide a continuous reading of remaining battery energy.

8 Claims, 5 Drawing Figures 4,693,119

LITHIUM BATTERY ENERGY MONITOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The widespread use of high energy lithium batteries has provided increased capabilities for portable and remotely deployed electronic packages. These advanced power sources have allowed vastly increased data gathering and transfer when compared to other conventional means. This is because of the benefits attained from the lithium sulphur dioxide balanced cell which higher cell operating voltage, exceptionally long field operation life, a higher energy density, lower temperature performance and superior shelf life.

One drawback, however, is that these superior power sources are relatively expensive. As a result, indiscriminate replacement of these batteries should be avoided when they still have considerable power in reserve. Usual practices call for the changing of many of the batteries at periodic intervals when high reliability is called for during field operations. Oftentimes however, partially discharged batteries would be more than adequate for additional use if their energy levels were known by operating personnel. Conventional testing techniques that may be adequate at a laboratory or depot simply do not lend themselves to field operations where such testing devices are bulky or where permanent installation generally is not feasible.

Thus the need exists in the state-of-the-art for a simple, easy to use, continuous monitor of lithium battery energy which is easily read, does not require appreciable operating energy, is conveniently packaged, is rugged and cost effective.

SUMMARY OF THE INVENTION

The present invention is directed to providing an apparatus for monitoring the energy level of a battery delivering a load current. An electromechanical transducer imparts a vibratory motion over a predetermined frequency range and is operatively connect to an electrolytic coulmeter having a cantilevered electrode for changing its resonance in response to accumulated deposits caused by the accumulated load current. A means in the form of an ammeter is electrically coupled to the electromechanical vibrator for indicating power drain at a consequent change of resonant frequency of the cantilevered electrode as more deposits are accumulated thereon to thereby provide an indication of the expended energy level of the battery

OBJECTS OF THE INVENTION

The prime object of the invention is to provide for a continuous monitor of lithium battery energy delivered.

Still another object provide for a lithium battery energy monitor which is uncomplicated and therefore easy to use.

Still another object of invention is to provide for a continuous lithium battery energy monitor that is easily read and does not require appreciable operating energy.

Still yet another object is to provide for a continuous lithium battery energy monitor which is compact and capable of being packaged with its lithium battery to enable operation in a field environment.

Another object is to provide a continous lithium battery energy monitor that is rugged and capable of reliable operation in the field.

Still yet another object of the invention is to provide for a continuous lithium battery energy monitor which is cost effective to enable its widespread application and use.

These and other objects of the invention will become more readily apparent from the ensuing description when taken with the appended drawings and the attached claims.

DESCRIPTION OF THE PREFERRED EMBODIMENTS

Figure 1:
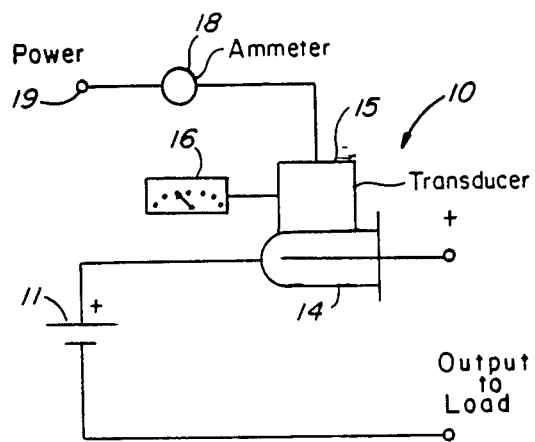
FIG. 1 shows a schematic diagram of the principal constituents of this inventive concept.

Referred now to FIG. 1 of the drawings an energy monitor 10 is coupled in series with a lithium battery 11 having its output coupled to a load. The lithium battery can be any one of several which provide for higher cell operating voltage, long field operation life, high energy density, low temperature performance and superior shelf life to mention but a few. The output is any of a wide variety of loads particularly suitable for lithium battery interconnections, for example a remote data gathering station or a portable transceiver are typical of applications which require the type of reliable high energy sources for which lithium batteries noted.

An electrolytic coulometer 14 is connected in series between the battery and the load and functions as the sensor for determining the energy expended and, consequently, the remaining energy left in the battery. The fabrication and operation of the coulometer will be elaborated on below, however, let it suffice to say at this point that it has the property of changing its resonance as a proportional function of battery energy expended.

A transducer 15 is held in an operative relationship with respect to the electrolytic coulometer and serves to transmit vibratory motion thereto across a predetermined frequency range. A piezoelectric stack or an electromagnetic shaker appropriately coupled to a driving signal generator can be employed to induce the proper mechanical vibratory motion to the electrolytic coulometer. The vibratory motion transmitted scans a frequency range determined by certain parameters within the coulometer as will be explained below.

An ammeter 18 or other suitable device indicating power transfer is connected in line with the transducer and a power source 19. The meter is to measure maximum power absorption in the electric coulometer at resonance. A readout meter 16 is coupled to the transducer 15 and gives a readout of the driving frequency being coupled from the transducer to the electrolytic coulometer. The meter provides a readout over a frequency range of interest which corresponds to a resonant frequency range expected in the coulometer.

The electrolytic coulometer is an appropriately modified commercially available unit marketed under the trade designation E-cell. E-cells are marketed by the Pacific Electron Corporation of 7200 East Fifteen Mile Road, Sterling Heights, Mich. 48077. The E-cell batteries' state-of-charge device is based on the principle of a small electrolytic coulometer which accurately measures the quantity of electric charge (coulombs) passed through it by a transfer of silver mass directly proportional to the current time product. Such an E-cell coulometer, when operating in a normal mode, has a voltage drop measured in millivolts. This low voltage drop results in milliwatts of power required in normal operation and zero power when in storage.

Figure 2A:
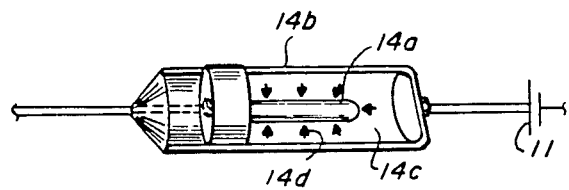
FIGS. 2a and 2b are schematical representations of one configuration of the electolytic coulometer.
Figure 2B:
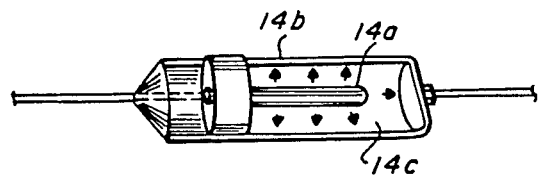

Noting FIGS. 2a and 2b a coulometer of this type measures the flow of electrons passing, for example, from lithium battery 11 to its load as electrons flow from a cantilevered gold plated electrode 14a to a silver case 14b via an electrolyte 14c. This causes silver ions designated by the arrows 14d to be deposited onto the gold electrode at a rate of precisely one ion of silver per electron. When the current flow stops, the plating stops and the record is preserved. Reversing the current flow, see FIG. 2b, causes a deplating of the electrode until all the silver ion is removed from the cantilevered electrode. The reversal of current will reduce the mass and provide a change of resonant frequency that is higher at battery depletion if a silver loaded cantilevered electrode is connected in reverse as more thoroughly explained in the penultimate paragraph.

This conventional E-cell is modified in accordance with the teachings of this inventive concept to select materials and appropriately shape the cantilevered electrode 14a to have a resonance which varies in direct proportion to a mass loading caused by the deposited silver ions on it. Again, an electrolyte 14c provides a medium through which silver ions traverse from the silver case 14b to the surface of the modified cantilevered electrode. A suitable plug and seal 14e assures the creation of a node at the base of the cantilevered electrode and retains the electrolyte within the E-cell.

The cantilevered electrode of the electrolytic coulometer is modified from that of a commercial E-cell in that the electrode is fabricated from a spring material with a mechanical resonance "Q" of 1,000 or more. The resonant frequency of the particular spring material chosen can be expressed as $$\text{resonant frequency} = \sqrt{k/m}$$

where k=the modulus of elasticity of the material chosen and m=the mass of the reference electrode at its mass center. In this equation for resonance it is seen that the resonance can be changed by changing the mass of the reference electrode. The action of the current going through the electrolytic coulometer 14 effects a mass transfer of silver from the case to the electrode. This transfer alters the mechanical natural resonant frequency in direct proportion to the transferred silver mass. This change in natural resonance is detected by exciting the electrolytic coulometer with transducer 15. The natural resonance change is detected by observing the free resonance of the electrode in response to the vibrational excitation by the tranducer. The transducer may be driven by a controllable surface generator which provides a visual indication of the driving frequency of the transducer on readout meter 16. At a condition of cantilevered electrode resonance most of the energy is absorbed by the transducer. This is because the electrode is immersed in the electrolyte in the electrolytic coulometer and the cantilevered electrode dissipates more energy into the electrolyte surrounding it. An increase in the driving current is noted at ammeter 13 when the condition of resonance occurs with respect to the vibrating cantilevered electrode.

Figure 3:
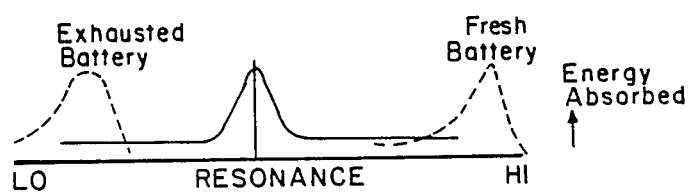
FIG. 3 depicts a graphical representation of the operational characteristics attributed to a continuous monitoring operation.

Referring to FIG. 3 a typical response which depicts the energy absorption (at a maximum at resonance of the cantilevered electrode) vs. the frequency. At a condition indicating a fresh battery, the mass of the cantilevered beam is lower and therefore the cantilevered electrode resonates at a higher frequency. As current continues to pass through the electrolytic coulometer the mass of the cantilevered electrode increases to a higher value such that the resonant frequency will be at a lower frequency indicating an exhausted battery. Empirically, the higher and lower frequency values are determined so that when these values are noted on an appropriate scale the operator knows that the battery is first at a fresh condition or secondly at a utilized or exhausted condition. Frequency indications between the higher and lower values indicate intermediate energy levels that can be correlated to predetermined energy levels.

The arrangement of the ammeter along with the frequency meter 16 has been depicted in FIG. 1. It is well within the scope of this inventive concept to substitute a very small microphone transducer with an LED or liquid crystal readout to be brought near the silver case anode to monitor the resonating frequency of the cantilevered electrode. Correlated percentage readings on an appropriate readout can indicate the expected percentage of battery life remaining.

Figure 4:
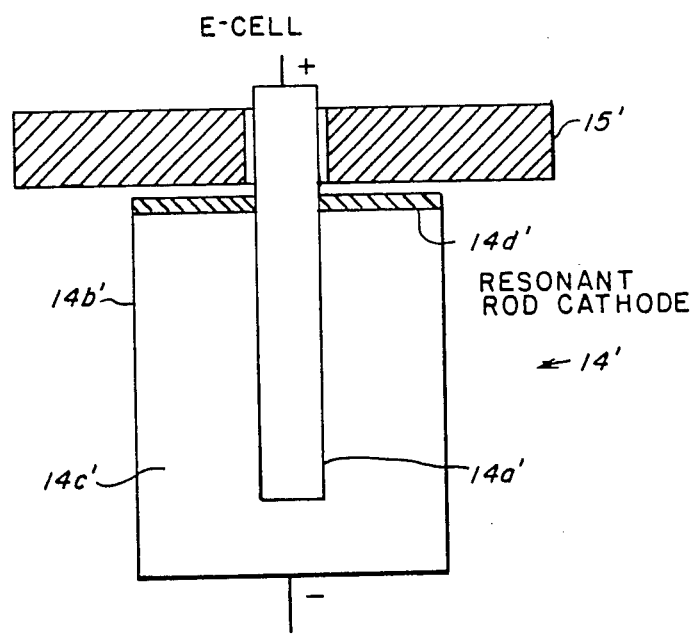
FIG. 4 shows a variation of the electrolytic coulometer that lends itself to electromagnetic actuation.

An alternate configuration of the electrolytic coulometer is shown in FIG. 4. An electrolytic coulometer 14' has a cantilevered electrode 14a' inside of a silver case 14b' which contains an electrolyte 14c'. A semi-rigid wall 14d' provided with appropriate seals, not shown, supports modified cantilevered electrode 14a' to provide a node point within the plane of the semi-rigid wall. A modified transducer in the form of an electromagnetic coil tranducer 15' stimulates the modified cantilevered electrode so that it vibrates about a fulcrum provided by wall 14d' in accordance with the driving frequency. Monitoring of the resonance of the electrode is performed in manners outlined above. This approach allows the tranducer to be separated from the case and the magnetic field stimulates the desired vibratory motion of the modified cantilevered electrode.

In both configurations of FIGS. 2a and 2b and FIG. 4, the E-cell is suitably modified to assure that the resonance of the cantilevered electrode is proportional to the square root of the spring constant divided by the mass of the electrode. Since current passed through the E-cell causes the transfer of silver ions from the case to the electrode, the added silver on the cantilevered electrode will change the resonance of the electrode. Because the mass transfer is directly proportional to the electric charge passed through the cell (and the deposited silver on the electrode) the resonant frequency of the electrode is directly proportional to the energy expended from lithium battery 11.

Thus at one frequency, a higher frequency, a battery can be said to be at a higher state, or fresh, since there has been no current passing through the electrolytic coulometer 14 and hence mass loading on the electrode is less and its consequent resonance is higher. As energy is transferred from battery 11 and through coulometer 14 more silver is deposited on the electrode and as a consequence the resonant frequency decreases as the mass on the rod increases.

In a variation in the aforedescribed apparatus the cantilevered electrode in the electric coulometer can be silver plated prior to interconnection with a lithium battery. The plated electrode-electric coulometer then is electrically coupled opposite to that described above so that current passing in the opposite direction will deplete the cantilevered electrode and reduce its mass. This decreasing mass will progressively increase the resonant frequency of the cantilevered electrode which can be monitored to provide an indication of a fresh battery at a relatively lower frequency and a depleted battery at a higher frequency.

Obviously many modifications and variations of the present invention are possible in the light of the above teachings. It is therefore to be understood that within the scope of the appended claims the invention may be practiced otherwise than as specifically described.

What is claimed is:

1. An apparatus for monitoring the energy level of a battery delivering a load current comprising:
    means for imparting vibratory motion over a predetermined frequency range;
    means connected to the battery and operatively coupled to the vibratory motion imparting means having a cantilevered electrode for changing its resonating mass in response to deposits thereon caused by accumulations of the load current; and
    means electrically coupled to the vibratory motion imparting means for indicating a change of resonant frequency of the resonating mass changing means as more deposits are accumulated on the cantilevered electrode thereby monitoring the energy level of the battery.

2. An apparatus according to claim 1 in which the resonating mass changing means is an electrolytic coulometer having a silver case anode and an electrolyte interposed between it and the cantilevered electrode functioning as a cathode, the deposits are silver coming from the silver case anode to the cantilevered electrode cathode and are proportional to the accumulated load current passing therebetween and the cantilevered electrode is selected to have a varying resonance mass over the predetermined range indicative of a fresh battery to an exhausted battery.

3. An apparatus according to claim 2 in which the cantilevered electrode is selected to have a modulus of elasticity and mass such that its resonant frequency has a first value at a battery current indicating a fresh battery and a lower resonant frequency at a battery current indicating an exhausted battery.

4. An apparatus according to claim 3 in which the motion imparting means is a piezoelectric tranducer physically in contact with the case anode and an ammeter indicates maximum energy absorption in the electrolyte as resonance of the cantilevered electrode is reached permitting a readout of frequency on an appropriate meter operatively disposed with respect to the tranducer.

5. An apparatus according to claim 3 in which the cantilevered electrode is modified to extend outside of the case anode through a semi-rigid wall, the extension is operatively engaged by a magnetic field from an electromagnetic field source to induce vibratory motion thereto.

6. An apparatus for monitoring the energy level of a battery delivering a load current comprising:
    means for imparting vibratory motion over a predetermined frequency range;
    means connected to the battery and operatively coupled to the vibratory motions imparting means having a cantilevered electrode having deposits thereon for changing its resonating mass in response to depleting the deposites thereon caused by load current passing therethrough; and
    means electrically coupled to the vibratory motion imparting means for indicating a change of resonant frequency of the resonating mass changing means as more deposits are depleted from the cantilevered electrode thereby monitoring the energy level of the battery.

7. An apparatus according to claim 6 in which the resonating mass changing means is an electrolytic coulometer having a silver case anode and an electrolyte interposed between it and the cantilevered electrode functioning as a cathode, the deposits are silver coming from the cantilevered electrode cathode to the silver case anode and are proportional to the accumulated load current passing therebetween and the cantilevered electrode is selected to have a varying resonance mass over the predetermined range indicative of a fresh battery to an exhausted battery.

8. An apparatus according to claim 7 in which the cantilevered electrode is selected to have a modulus of elasticity and mass such that its resonant frequency has a first value at a battery current indicating a fresh battery and a higher resonant frequency at a battery current indicating an exhausted battery.

* * * * *